US012535740B2

(12) United States Patent
Lin et al.

(10) Patent No.: US 12,535,740 B2
(45) Date of Patent: Jan. 27, 2026

(54) INTERSTITIAL TYPE ABSORBER FOR EXTREME ULTRAVIOLET MASK

(71) Applicant: Taiwan Semiconductor Manufacturing Co., Ltd., Hsinchu (TW)

(72) Inventors: Yi-Jhih Lin, Hsinchu (TW); Pei-Cheng Hsu, Hsinchu (TW); Ta-Cheng Lien, Hsinchu (TW); Chia-Jen Chen, Hsinchu (TW); Hsin-Chang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 840 days.

(21) Appl. No.: 17/716,522

(22) Filed: Apr. 8, 2022

(65) Prior Publication Data

US 2023/0013260 A1    Jan. 19, 2023

Related U.S. Application Data

(60) Provisional application No. 63/220,415, filed on Jul. 9, 2021.

(51) Int. Cl.
*G03F 1/24*  (2012.01)
*G03F 1/56*  (2012.01)
(Continued)

(52) U.S. Cl.
CPC ............ *G03F 7/70033* (2013.01); *G03F 1/24* (2013.01); *G03F 1/56* (2013.01); *G03F 7/091* (2013.01)

(58) Field of Classification Search
CPC ..................................... G03F 1/22; G03F 1/24
See application file for complete search history.

(56) References Cited

U.S. PATENT DOCUMENTS 5,641,593 A * 6/1997 Watanabe ............. G03F 7/2039
430/394
11,003,069 B2    5/2021 Yu et al.
(Continued)

FOREIGN PATENT DOCUMENTS

CN    107452602 A    12/2017
DE    102004013459 A1    11/2004
(Continued)

OTHER PUBLICATIONS

PubCHEM, "atomic radii of the elements", (no date).*
(Continued)

*Primary Examiner* — Martin J Angebranndt
(74) *Attorney, Agent, or Firm* — Seed IP Law Group

(57) ABSTRACT

A method for lithographically patterning a photoresist is provided. The method includes receiving a wafer with the photoresist and exposing the photoresist using an extreme ultraviolet (EUV) radiation reflected by an EUV mask. The EUV mask includes a substrate, a reflective multilayer stack on the substrate, a capping layer on the reflective multilayer stack, a patterned absorber layer on the capping layer. The patterned absorber layer includes a matrix metal and an interstitial element occupying interstitial sites of the matrix metal, and a size ratio of the interstitial element to the matrix metal is from about 0.41 to about 0.59.

20 Claims, 10 Drawing Sheets

(51) Int. Cl.
*G03F 7/00* (2006.01)
*G03F 7/09* (2006.01)

(56) References Cited

U.S. PATENT DOCUMENTS

| | | | |
|---|---|---|---|
| 12,181,797 B2 * | 12/2024 | Hsu | H01L 21/0332 |
| 2005/0100797 A1 * | 5/2005 | Shoki | B82Y 40/00 |
| | | | 430/311 |
| 2012/0021344 A1 * | 1/2012 | Matsuo | B82Y 10/00 |
| | | | 430/5 |
| 2014/0272678 A1 * | 9/2014 | Shih | G03F 7/20 |
| | | | 430/5 |
| 2014/0356770 A1 * | 12/2014 | Hayashi | G03F 1/24 |
| | | | 430/5 |
| 2015/0198874 A1 * | 7/2015 | Ikuta | G03F 1/78 |
| | | | 430/5 |
| 2015/0212402 A1 * | 7/2015 | Patil | G03F 1/24 |
| | | | 430/5 |
| 2019/0369483 A1 * | 12/2019 | Ikebe | G03F 1/40 |
| 2019/0384157 A1 * | 12/2019 | Ikebe | G03F 1/22 |
| 2020/0073224 A1 | 3/2020 | Chen et al. | |
| 2020/0103742 A1 * | 4/2020 | Lee | G03F 1/80 |
| 2021/0063865 A1 * | 3/2021 | Lin | G03F 1/38 |
| 2021/0096456 A1 * | 4/2021 | Suzuki | G03F 1/48 |
| 2021/0103210 A1 | 4/2021 | Tu et al. | |
| 2021/0124256 A1 * | 4/2021 | Jindal | G03F 1/54 |
| 2021/0132487 A1 * | 5/2021 | Shin | G03F 1/48 |
| 2021/0200078 A1 | 7/2021 | Lee et al. | |
| 2022/0137499 A1 * | 5/2022 | Hsu | G03F 1/24 |
| | | | 430/5 |
| 2022/0351972 A1 * | 11/2022 | Leung | H01L 21/0335 |

FOREIGN PATENT DOCUMENTS

| | | | | |
|---|---|---|---|---|
| DE | 102017221146 A1 * | 3/2018 | | G21K 1/06 |
| DE | 102019100839 A1 | 7/2020 | | |
| DE | 102022100087 A1 | 12/2022 | | |
| JP | 2003318101 A * | 11/2003 | | G03F 1/38 |
| JP | 2004006798 A * | 1/2004 | | |
| JP | 2004289048 A * | 10/2004 | | |
| JP | 2004318101 A * | 11/2004 | | |
| JP | 2007251205 A | 9/2007 | | |
| JP | 2007273678 A * | 10/2007 | | |
| JP | 2009200423 A * | 9/2009 | | |
| KR | 2013085774 A * | 7/2013 | | G03F 1/24 |
| KR | 20210038360 A | 4/2021 | | |
| TW | 201418869 A | 5/2014 | | |
| TW | 201518855 A * | 5/2015 | | G03F 1/22 |
| TW | 202013056 A | 4/2020 | | |
| TW | 202020552 A | 6/2020 | | |
| TW | 202109171 A | 3/2021 | | |
| WO | WO 2020175354 A1 | 9/2020 | | |

OTHER PUBLICATIONS

Li, Hengde, "Modern Materials Science and Engineering Dictionary", Shandong Science and Technology Press, pp. 92-94, Aug. 2001.

* cited by examiner

INTERSTITIAL TYPE ABSORBER FOR EXTREME ULTRAVIOLET MASK

PRIORITY CLAIM AND CROSS-REFERENCE

This application claims the benefit of U.S. Provisional Patent Application No. 63/220,415, filed Jul. 9, 2021, which is incorporated by reference herein in its entirety.

BACKGROUND

The semiconductor industry has experienced exponential growth. Technological advances in materials and design have produced generations of integrated circuits (ICs), where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
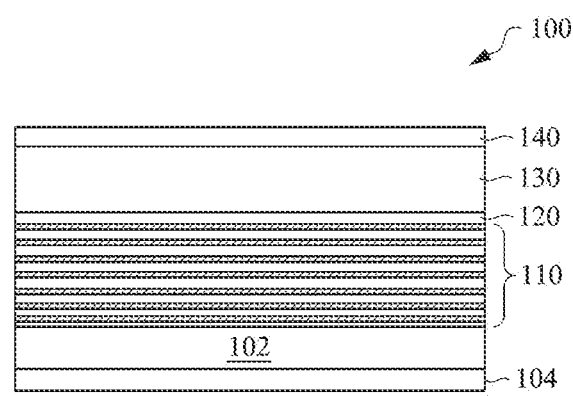
FIG. 1 is a cross-sectional view of an extreme ultraviolet (EUV) mask blank, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the manufacture of integrated circuits (ICs), patterns representing different layers of the ICs are fabricated using a series of reusable photomasks (also referred to herein as photolithography masks or masks) in order to transfer the design of each layer of the ICs onto a semiconductor substrate during the semiconductor device fabrication process.

With the shrinkage in IC size, extreme ultraviolet (EUV) light with a wavelength of 13.5 nm is employed in a lithography process to enable transfer of very small patterns (e.g., nanometer-scale patterns) from a mask to a semiconductor wafer. Because most materials are highly absorbing at the wavelength of 13.5 nm, EUV lithography utilizes a reflective-type EUV mask having a reflective multilayer to reflect the incident EUV light and an absorber layer on top of the reflective multilayer to absorb the EUV light in areas where light is not supposed to be reflected by the mask. The mask pattern defined by the absorber layer is thus transferred to a semiconductor wafer. Currently, tantalum (Ta) is the main component of most common absorber materials developed for EUV masks.

In EUV lithography, to avoid overlap of incident light and reflected light, the EUV mask is illuminated with obliquely incident light that is tilted at a 6-degree angle relative to the axis perpendicular to the mask plan. The oblique incident EUV light is reflected by the reflective multilayer or absorbed by the absorber layer. On that occasion, if the absorber layer is thick, shadows are formed around the absorber lines that can make the absorber shapes to appear wider. The mask shadowing effects, also known as mask 3D effects, can result in unwanted feature-size dependent focus and pattern placement shifts. The mask 3D effects become worse as the technology node advances, accordingly, the absorber thickness has to be reduced as much as possible to minimize the impact of mask 3D effects. However, the current Ta-based absorbers such as TaN and TaBN are at the limit for imaging extendibility. Ta-based absorber thickness required to attain a reflectivity of less than 2% in a EUV mask is about 50-80 nm, which causes mask 3D effects. Thinning down below 50 nm Ta-based absorber thickness will reduce the amount of absorbed light, reduce the normalized image log-slope (NILS) and increase best variation through pitch. The utilization of alternative absorber materials with higher extinction coefficients k would considerably reduce the absorber layer thickness and hence, mitigate the mask 3D effects.

In embodiments of the present disclosure, interstitial type materials with high extinction coefficient κ are provided as absorbers for EUV masks. The interstitial type high κ materials are comprised of a matrix metal and an interstitial element occupying interstitial sites of the matrix metal. The size ratio of the interstitial element to the matrix metal is from about 0.41 to about 0.59 so that atoms of the interstitial element occupy octahedral sites in the face-centered-cubic (FCC), body-centered-cubic (bcc), and hexagonal-closed-packed (HCP) crystal lattice of the matrix metal. By using these interstitial type materials as absorbers in EUV masks, a thin absorber layer with a thickness less than 50 nm can be used to reduce the mask 3D effects. As a result, the scanner throughput is improved.

The following description relates to a mask fabrication process which includes two steps, a mask blank fabrication process and a mask fabrication process. During the mask blank fabrication process, a mask blank is formed by depositing suitable layers (e.g., multiple reflective layers) on a suitable substrate. The mask blank is patterned during the mask fabrication process to form a mask that has a design of a layer of an IC device.

FIG. 1 is a cross-sectional view of an EUV mask blank 100, in accordance with a first embodiment of the present disclosure.

Referring to FIG. 1, the EUV mask blank 100 includes a substrate 102, a reflective multilayer stack 110 over a front surface of the substrate 102, a capping layer 120 over the reflective multilayer stack 110, an absorber layer 130 over the capping layer 120, and a hard mask layer 140 over the absorber layer 130. The EUV mask blank 100 further includes a conductive layer 104 over a back surface of the substrate 102 opposite the front surface. The absorber layer 130 includes an interstitial type material composed of a matrix metal and interstitial elements occupying interstitial sites of the matrix metal. The interstitial elements are non-metal elements with very small radii such as boron, carbon, nitrogen, silicon, and phosphorous.

Figure 2:
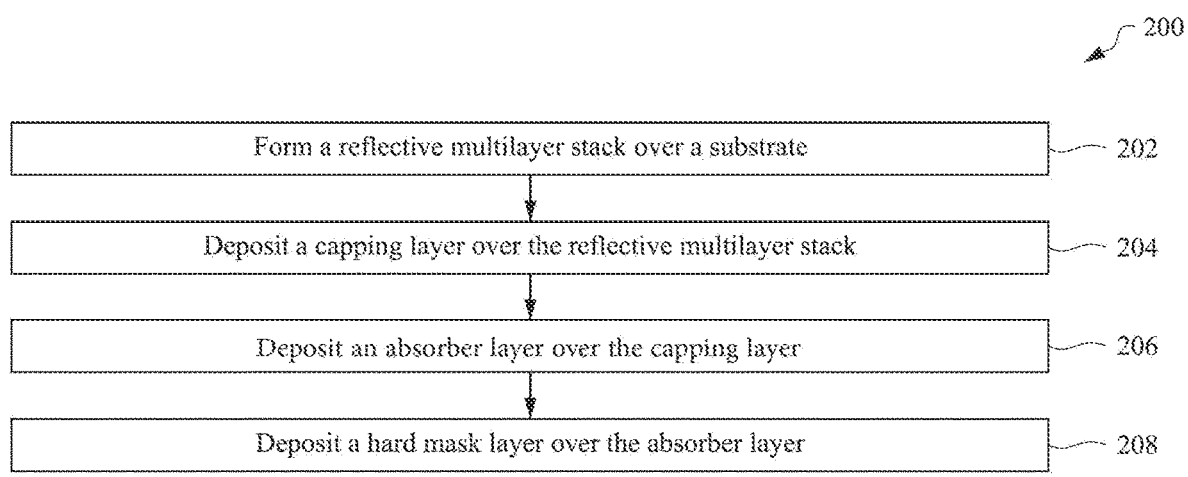
FIG. 2 is a flowchart of a method for fabricating the EUV mask blank of FIG. 1, in accordance with some embodiments.

FIG. 2 is a flowchart of a method 200 for fabricating an EUV mask blank, for example, EUV mask blank 100, in accordance with some embodiments. FIG. 3A through FIG. 3D are cross-sectional views of the EUV mask blank 100 at various stages of the fabrication process, in accordance with some embodiments. The method 200 is discussed in detail below, with reference to the EUV mask blank 100. In some embodiments, additional operations are performed before, during, and/or after the method 200, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 3A:
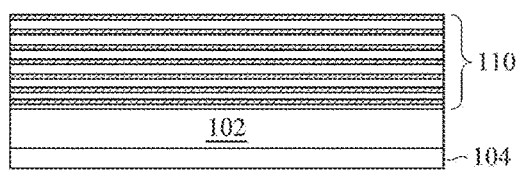
FIGS. 3A-3D are cross-sectional views of an EUV mask blank at various stages of the fabrication process of FIG. 2, in accordance with some embodiments.

Referring to FIGS. 2 and 3A, the method 200 includes operation 202, in which a reflective multilayer stack 110 is formed over a substrate 102, in accordance with some embodiments. FIG. 3A is a cross-sectional view of an initial structure of an EUV mask blank 100 after forming the reflective multilayer stack 110 over the substrate 102, in accordance with some embodiments.

Referring to FIG. 3A, the initial structure of the EUV mask blank 100 includes a substrate 102 made of glass, silicon, quartz, or other low thermal expansion materials. The low thermal expansion material helps to minimize image distortion due to mask heating during use of the EUV mask blank 100. In some embodiments, the substrate 102 includes fused silica, fused quartz, calcium fluoride, silicon carbide, black diamond, or titanium oxide doped silicon oxide ($SiO_2/TiO_2$). In some embodiments, the substrate 102 has a thickness ranging from about 1 mm to about 7 mm. If the thickness of the substrate 102 is too small, a risk of breakage or warping of the EUV mask blank 100 increases, in some instances. On the other hand, if the thickness of the substrate is too great, the weight of the EUV mask blank 100 is needlessly increased, in some instances.

In some embodiments, a conductive layer 104 is disposed on a back surface of the substrate 102. In some embodiments, the conductive layer 104 is in direct contact with the back surface of the substrate 102. The conductive layer 104 is adapted to provide for electrostatically coupling of the EUV mask blank 100 to an electrostatic mask chuck (not shown) during fabrication the EUV mask blank 100. In some embodiments, the conductive layer 104 includes chromium nitride (CrN) or tantalum boride (TaB). In some embodiments, the conductive layer 104 is formed by a deposition process such as, for example, chemical vapor deposition (CVD), plasma-enhanced chemical vapor deposition (PECVD), or physical vapor deposition (PVD). The thickness of the conductive layer 104 is controlled such that the conductive layer 104 is optically transparent.

The reflective multilayer stack 110 is disposed over a front surface of the substrate 102 opposite the back surface. In some embodiments, the reflective multilayer stack 110 is in direct contact with the front surface of the substrate 102. The reflective multilayer stack 110 provides a high reflectivity to the EUV light. In some embodiments, the reflective multilayer stack 110 is configured to achieve about 60% to about 75% reflectivity at the peak EUV illumination wavelength, e.g., the EUV illumination at 13.5 nm. Specifically, when the EUV light is applied at an incident angle of 6° to the surface of the reflective multilayer stack 110, the maximum reflectivity of light in the vicinity of a wavelength of 13.5 nm is about 60%, about 62%, about 65%, about 68%, about 70%, about 72%, or about 75%.

In some embodiments, the reflective multilayer stack 110 includes alternatively stacked layers of a high refractive index material and a low refractive index material. A material having a high refractive index has a tendency to scatter EUV light on the one hand, and a material having a low refractive index has a tendency to transmit EUV light on the other hand. Pairing these two type materials together provides a resonant reflectivity. In some embodiments, the reflective multilayer stack 110 includes alternatively stacked molybdenum (Mo) layers and silicon (Si) layers. In some embodiments, the reflective multilayer stack 110 includes alternatively stacked Mo and Si layers with a Si layer being the topmost layer. In some embodiments, a Mo layer is in direct contact with the front surface of the substrate 102. In other some embodiments, a Si layer is in direct contact with the front surface of the substrate 102. Alternatively, the reflective multilayer stack 110 includes alternatively stacked layers of Mo and beryllium (Be).

The thickness of each layer in the reflective multilayer stack 110 depends on the EUV wavelength and the incident angle of the EUV light. The thickness of alternating layers in the reflective multilayer stack 110 is tuned to maximize the constructive interference of the EUV light reflected at each interface and to minimize the overall absorption of the EUV light. In some embodiments, the reflective multilayer stack 110 includes from 20 to 60 pairs of alternating Mo layers and Si layers. Each Mo and Si layer pair may have a thickness ranging from about 2 nm to about 7 nm, with a total thickness ranging from about 100 nm to about 300 nm.

In some embodiments, each layer in the reflective multilayer stack 110 is deposited over the substrate 102 and underlying layer using ion beam deposition (IBD) or DC magnetron sputtering. The deposition method used helps to ensure that the thickness uniformity of the reflective multilayer stack 110 is better than about 0.85 across the substrate 102. For example, to form a Mo/Si reflective multilayer stack 110, a Mo layer is deposited using a Mo target as the sputtering target and an argon (Ar) gas (having a gas pressure of from $1.3 \times 10^{-2}$ Pa to $2.7 \times 10^{-2}$ Pa) as the sputtering gas with an ion acceleration voltage of from 300 V to 1,500 V at a deposition rate of from 0.03 to 0.30 nm/sec and then a Si layer is deposited using a Si target as the sputtering target and an Ar gas (having a gas pressure of $1.3 \times 10^{-2}$ Pa to $2.7 \times 10^{-2}$ Pa) as the sputtering gas, with an ion acceleration voltage of from 300 V to 1,500 V at a deposition rate of from 0.03 to 0.30 nm/sec. By stacking Si layers and Mo layers in 20 to 60 cycles, each of the cycles comprising the above steps, the Mo/Si reflective multilayer stack is deposited.

Figure 3B:
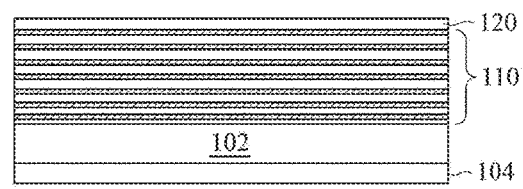

Referring to FIGS. 2 and 3B, the method 200 proceeds to operation 204, in which a capping layer 120 is deposited over the reflective multilayer stack 110, in accordance with some embodiments. FIG. 3B is a cross-sectional view of the structure of FIG. 3A after depositing the capping layer 120 over the reflective multilayer stack 110, in accordance with some embodiments.

Referring to FIG. 3B, the capping layer 120 is disposed over the topmost surface of the reflective multilayer stack 110. The capping layer 120 helps to protect the reflective multilayer stack 110 from oxidation and any chemical etchants to which the reflective multilayer stack 110 may be exposed during subsequent mask blank and mask fabrication processes.

In some embodiments, the capping layer 120 includes a material that resists oxidation and corrosion, and has a low chemical reactivity with common atmospheric gas species such as oxygen, nitrogen, and water vapor. In some embodiments, the capping layer 120 includes a transition metal such as, for example, ruthenium (Ru), iridium (Ir), rhodium (Rh), platinum (Pt), palladium (Pd), osmium (Os), rhenium (Re), vanadium (V), tantalum (Ta), hafnium (Hf), tungsten (W), molybdenum (Mo), zirconium (Zr), manganese (Mn), technetium (Tc), or alloys thereof.

In some embodiments, the capping layer 120 is formed using a deposition process such as, for example, IBD, CVD, PECVD, PVD, or atomic layer deposition (ALD). The deposition of the capping layer 120 is often carried out at a relatively low temperature, for example, less than 150° C., to prevent inter-diffusion of the reflective multilayer stack 110. In instances where a Ru layer is to be formed as the capping layer 120 using IBD, the deposition may be carried out in an Ar atmosphere by using a Ru target as the sputtering target.

Figure 3C:
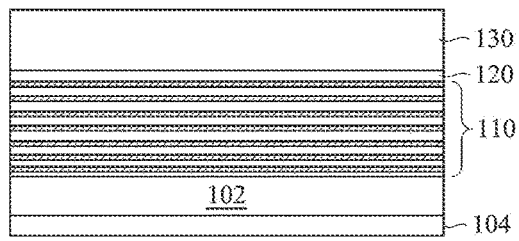

Referring to FIGS. 2 and 3C, the method 200 proceeds to operation 206, in which an absorber layer 130 is deposited over the capping layer 120, in accordance with some embodiments. FIG. 3C is a cross-sectional view of the structure of FIG. 3B after depositing the absorber layer 130 over the capping layer 120, in accordance with some embodiments.

The absorber layer 130 is usable for absorbing radiation projected onto the EUV mask. The absorber layer 130 includes an absorber material having a high extinction coefficient κ and a refractive index n close to 1 in the EUV wavelength range. In some embodiments, the absorber layer 130 includes an absorber material having a high extinction coefficient κ and a low refractive index at 13.5 nm wavelength. In some embodiments, the extinction coefficient κ of the absorber material of the absorber layer 130 is in a range from about 0.04 to 0.08. In some embodiments, the refractive index n of the absorber material of the absorber layer 130 is in a range from 0.87 to 1.

In some embodiments, the absorber layer 130 includes an interstitial compound comprised of a matrix metal and an interstitial element occupying interstitial sites of the matrix metal. The interstitial element helps to increase the density of the matrix metal, which leads to an increase in the extinction coefficient of the matrix metal. The matrix metal of the present disclosure manifests a cubic or hexagonal crystalline lattice structure, the interstitial element therefore is disposed interstitially in the crystal lattice and the crystalline lattice of the matrix metal is preserved.

In order for the formation of interstitial compounds to occur, the size of the interstitial element needs to be sufficiently small to fit into the interstitial sites of the matrix metal. In some embodiments, the ratio of the atomic radius ($r_X$) of the interstitial element to the atomic radius ($r_M$) of the matrix metal is selected to be from about 0.41 to about 0.59. When the radius ratio ($r_X/r_M$) is greater than 0.59, the interstitial element is too big to fit into the interstitial sites of the matrix metal. On the other hand, if the radius ratio ($r_X/r_M$) is less than 0.41, the interstitial element is too small to be useful for increasing the density of the matrix metal.

Suitable matrix metals are those metals having high absorption coefficients in the EUV wavelength region. In some embodiments, the matrix metal is a transition metal selected from groups 3-12 of the periodic table of the elements.

In some embodiments, the matrix metal is a transition metal from group 3, such as yttrium (Y). In some embodiments, the matrix metal is a transition metal from group 4, such as titanium (Ti), zirconium (Zr), or hafnium (Hf). In some embodiments, the matrix metal is a transition metal from group 5, such as vanadium (V). In some embodiments, the matrix metal is a transition metal from group 6, such as chromium (Cr) or tungsten (W). In some embodiments, the matrix metal is a transition metal from group 9, such as cobalt (Co) or iridium (Ir). In some embodiments, the matrix metal is a transition metal from group 10, such as nickel (Ni). In some embodiments, the matrix metal is an alloy of tantalum (Ta) and one or more of the above transitional metals.

The interstitial element is a light non-metal element such as boron (B), carbon (C), nitrogen (N), silicon (Si), or phosphorus (P). The resulting interstitial compounds are transition metal borides, transition metal carbides, transition metal nitrides, transition metal silicides, or transition metal phosphides.

Exemplary interstitial compounds of the present disclosure having radius ratios of matrix metals and interstitial elements between 0.41 and 0.59 are provided in Table 1.

TABLE 1

Interstitial Compounds for Use in Absorber layer

| | Matrix Metal | | | | | | | | | |
|---|---|---|---|---|---|---|---|---|---|---|
| | Cr | Ti | W | Zr | Ir | Ni | Co | V | Y | Hf |
| Interstitial Compound | $Cr_3C_2$ | TiC | $W_2C$ | ZrC | $Ir_5C_3$ | $Ni_3C$ | $Co_3C$ | $V_4C_3$ | $Y_2C$ | HfC |
| | $Cr_7C_3$ | $TiB_2$ | $W_2N$ | $ZrC_2$ | $Ir_4C_5$ | $Ni_3N$ | $Co_2C$ | VN | YN | HfN |
| | $Cr_{23}C_6$ | TiN | $W_3N_2$ | $ZrB_2$ | $IrC_2$ | | $Co_2N$ | $VSi_2$ | $YB_2$ | |
| | $Cr_4C$ | $TiSi_2$ | | ZrN | $Ir_3C_7$ | | $Co_3N$ | $V_3Si$ | $YSi_2$ | |
| | $Cr_2N$ | | | $ZrSi_2$ | $IrC_3$ | | $Co_4C$ | | $YC_2$ | |
| | $Cr_2B$ | | | | $IrC_4$ | | $Co_2Si$ | | | |
| | $CrB_2$ | | | | $IrN_2$ | | | | | |
| | | | | | $Ir_3Si$ | | | | | |

In some embodiments, the interstitial compound is comprised of a matrix alloy of two or more transitional metals and an interstitial element occupying interstitial sites of the alloy. In some embodiments, the alloy is a binary alloy of Cr and Ta, and the interstitial element is N. In some embodiments, the alloy is a ternary alloy of Cr, Ta, and V, and the interstitial element is N.

In some embodiments, the absorber layer 130 includes the transitional metal in a concentration ranging from about 20% by weight to about 95% by weight. In some embodiments, the absorber layer 130 includes the transitional metal in a concentration about 20% by weight, about 25% by weight, about 30% by weight, about 35% by weight, about 40% by weight, about 45% by weight, about 50% by weight, about 55% by weight, about 60% by weight, about 65% by weight, about 70% by weight, about 75% by weight, about 80% by weight, about 85% by weight, about 90% by weight, about 92% by weight, about 93% by weight, about 94% by weight, or about 95% by weight.

In some embodiments, the absorber layer 130 includes the interstitial element in a concentration ranging from about 5% by weight to about 80% by weight. In some embodiments, the absorber layer 130 includes the interstitial element in a concentration about 5% by weight, about 10% by weight, about 15% by weight, about 20% by weight, about 25% by weight, about 30% by weight, about 35% by weight, about 40% by weight, about 45% by weight, about 50% by weight, about 55% by weight, about 60% by weight, about 65% by weight, about 70% by weight, about 75% by weight, or about 80% by weight.

Because the interstitial compounds of the present application have high extinction coefficients in the EUV wavelength range, a thin absorber layer 130 with a thickness less than 50 nm can be used to provide sufficient EUV absorption, while reducing the mask 3D effects. In some embodiments, the absorber layer 130 may have a thickness ranging from about 30 nm to about 40 nm.

The absorber layer 130 is formed by deposition techniques such as PVD, CVD, ALD, RF magnetron sputtering, DC magnetron sputtering, or IBD. The deposition process is carried out in the presence of interstitial elements, such as B, C, N, Si, or P. Carrying out the deposition in the presence of the interstitial elements results in the interstitial elements being incorporated into the interstitial sites of the absorber layer 130.

In embodiments of the present disclosure, by using interstitial compounds having a high extinction coefficient κ as the absorber material, the mask 3D effects caused by EUV phase distortion can be reduced. As a result, the best focus shifts and pattern placement errors can be reduced, while the normalized image log-slope (NILS) can be increased.

Figure 3D:
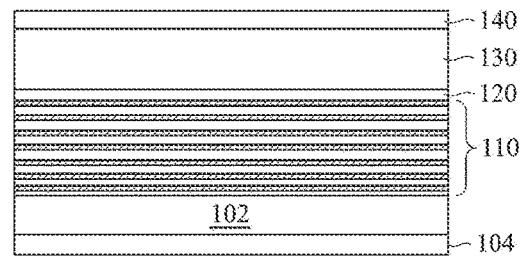

Referring to FIGS. 2 and 3D, the method 200 proceeds to operation 208, in which a hard mask layer 140 is deposited over the absorber layer 130, in accordance with some embodiments. FIG. 3D is a cross-sectional view of the structure of FIG. 3C after depositing hard mask layer 140 over the absorber layer 130, in accordance with some embodiments.

Referring to FIG. 3D, the hard mask layer 140 is disposed over the absorber layer 130. The hard mask layer 140 possesses different etching characterizes from the absorber layer 130, and thereby serves as an etch stop layer to prevent damages to the absorber layer 130 during the photolithography process. In some embodiments, the hard mask layer 140 serves as an anti-reflection layer for reducing a reflection of the EUV radiation. In some embodiments, the hard mask layer 140 includes a dielectric material such as, for example, SiN, TaBO, TaO, CrO, or CrON.

In some embodiments, the hard mask layer 140 is formed using a deposition process such as, for example, CVD, PECVD, or PVD.

Additionally or alternatively, in some embodiments, a buffer layer (not shown) is formed on the capping layer 120 as an etch stop layer for patterning the absorber layer 130 and a sacrificial layer during a subsequent focused ion beam defect repair process for the absorber layer 130. The buffer layer may include silicon dioxide ($SiO_2$), silicon oxynitride (SiON), or other suitable materials.

Figure 4:
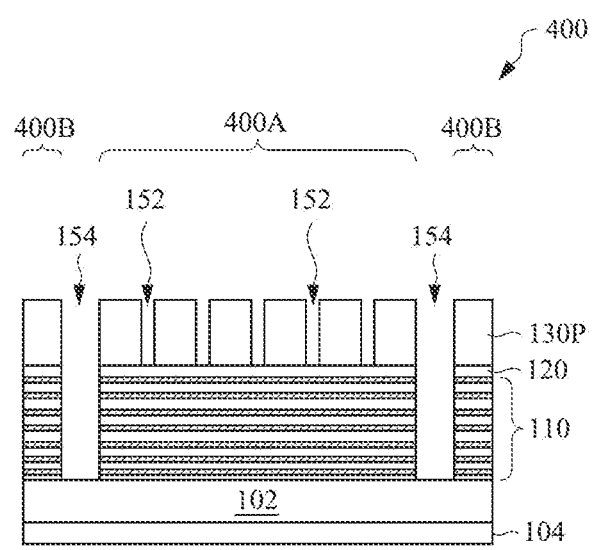
FIG. 4 is a cross-sectional view of an EUV mask, in accordance with some embodiments.

FIG. 4 is a cross-sectional view of an EUV mask 400 that is formed by patterning the absorber layer 130 of the EUV mask blank 100, in accordance with a second embodiment of the present disclosure. Referring to FIG. 4, the EUV mask 400 includes a substrate 102, a reflective multilayer stack 110 over a front surface of the substrate 102, a capping layer 120 over the reflective multilayer stack 110, and a patterned absorber layer 130P over the capping layer 120. The EUV mask 400 further includes a conductive layer 104 over a back surface of the substrate 102 opposite the front surface.

The patterned absorber layer 130P contain a pattern of openings 152 that correspond to circuit patterns to be formed on a semiconductor wafer. The pattern of openings 152 is located in a pattern region 400A of the EUV mask 400, exposing a surface of the capping layer 120. The pattern region 400A is surrounded by a peripheral region 400B of the EUV mask 400. The peripheral region 400B corresponds to a non-patterned region of the EUV mask 400 that is not used in an exposing process during IC fabrication. In some embodiments, the pattern region 400A of EUV mask 400 is located at a central region of the substrate 102, and the peripheral region 400B is located at an edge portion of the substrate 102. The pattern region 400A is separated from the peripheral region 400B by trenches 154. The trenches 154 extend through the patterned absorber layer 130P, the capping layer 120, and the reflective multilayer stack 110, exposing the front surface of the substrate 102.

Figure 5:
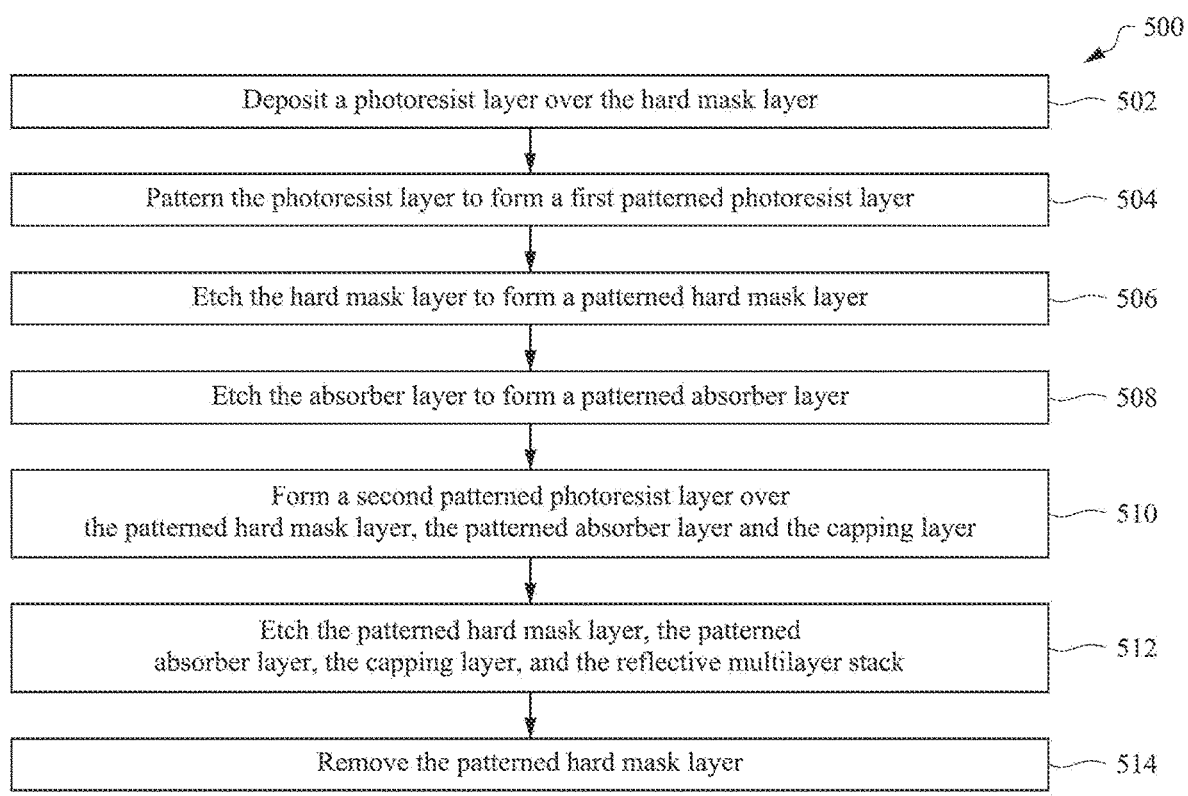
FIG. 5 is a flowchart of a method for fabricating the EUV mask of FIG. 4, in accordance with some embodiments.

FIG. 5 is a flowchart of a method 500 for fabricating an EUV mask, for example, EUV mask 400, in accordance with some embodiments. FIG. 6A through FIG. 6G are cross-sectional views of the EUV mask 400 at various stages of the fabrication process, in accordance with some embodiments. The method 500 is discussed in detail below, with reference to the EUV mask 400. In some embodiments, additional operations are performed before, during, and/or after the method 500, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 6A:
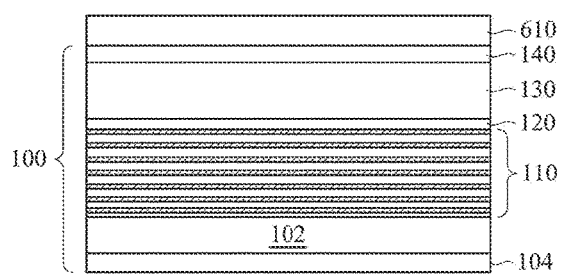
FIGS. 6A-6G are cross-sectional views of an EUV mask at various stages of the fabrication process of FIG. 5, in accordance with some embodiments.

Referring to FIGS. 5 and 6A, the method 500 includes operation 502, in which a photoresist layer 610 is deposited over the hard mask layer 140, in accordance with some embodiments. FIG. 6A is a cross-sectional view of a structure after depositing the photoresist layer 610 over the hard mask layer 140, in accordance with some embodiments.

Referring to FIG. 6A, the photoresist layer 610 is disposed over the topmost surface of the EUV mask blank 100, i.e., the hard mask layer 140. The photoresist layer 610 includes a photosensitive material operable to be patterned by radiation. In some embodiments, the photoresist layer 610 includes a positive-tone photoresist material, and a negative-tone photoresist material or a hybrid-tone photoresist material. In some embodiments, the photoresist layer 610 is applied to the surface of the hard mask layer 140, for example, by spin coating.

Figure 6B:
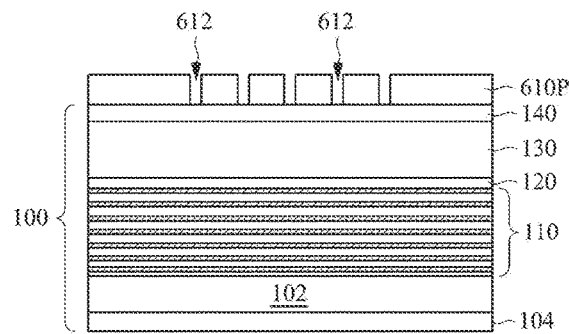

Referring to FIGS. 5 and 6B, the method 500 proceeds to operation 504, in which the photoresist layer 610 is lithographically patterned to form a patterned photoresist layer 610P, in accordance with some embodiments. FIG. 6B is a cross-sectional view of the structure of FIG. 6A after lithographically patterning the photoresist layer 610 to form the patterned photoresist layer 610P, in accordance with some embodiments.

Referring to FIG. 6B, the photoresist layer 610 is patterned by first subjecting the photoresist layer 610 to a pattern of irradiation. Next, the exposed or unexposed portions of the photoresist layer 610 are removed depending on whether a positive-tone or negative-tone resist is used in the photoresist layer 610 with a resist developer, thereby forming the patterned photoresist layer 610P having a pattern of openings 612 formed therein. The openings 612 expose portions of the hard mask layer 140. The openings 612 are located in the pattern region 400A and correspond to locations where the pattern of openings 152 are present in the EUV mask 400 (FIG. 4).

Figure 6C:
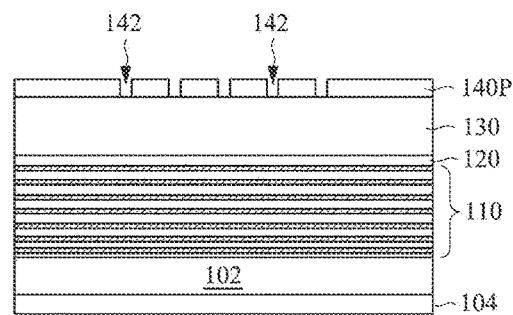

Referring to FIGS. 5 and 6C, the method 500 proceeds to operation 506, in which the hard mask layer 140 is etched using the patterned photoresist layer 610P as an etch mask to form a patterned hard mask layer 140P, in accordance with some embodiments. FIG. 6C is a cross-sectional view of the structure of FIG. 6B after etching the hard mask layer 140 to form the patterned hard mask layer 140P, in accordance with some embodiments.

Referring to FIG. 6C, portions of the hard mask layer 140 that are exposed by the openings 612 are etched to form openings 142 extending through the hard mask layer 140. The openings 142 expose portions of the underlying absorber layer 130. In some embodiments, the hard mask layer 140 is etched using an anisotropic etch. In some embodiments, the anisotropic etch is a dry etch such as, for example, reactive ion etch (RIE), a wet etch, or a combination thereof. The etch removes the material providing the hard mask layer 140 selective to the material providing the absorber layer 130. The remaining portions of the hard mask layer 140 constitute the patterned hard mask layer 140P. If not completely consumed during the etching of the hard mask layer 140, after etching the hard mask layer 140, the patterned photoresist layer 610P is removed from the surfaces of the patterned hard mask layer 140P, for example, using wet stripping or plasma ashing.

Figure 6D:
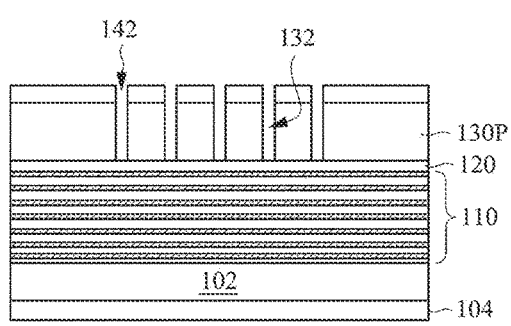

Referring to FIGS. 5 and 6D, the method 500 proceeds to operation 508, in which the absorber layer 130 is etched using the patterned hard mask layer 140P as an etch mask to form a patterned absorber layer 130P, in accordance with some embodiments. FIG. 6D is a cross-sectional view of the structure of FIG. 6C after etching the absorber layer 130 to form the patterned absorber layer 130P, in accordance with some embodiments.

Referring to FIG. 6D, portions of the absorber layer 130 that are exposed by the openings 142 are etched to form openings 132 extending through the absorber layer 130. The openings 132 expose portions of the underlying capping layer 120. The openings 132 in the patterned absorber layer 130P define the pattern of openings 152 in the EUV mask 400. In some embodiments, the absorber layer 130 is etched using an anisotropic etching process. In some embodiments, the anisotropic etch is a dry etch such as, for example, RIE, a wet etch, or a combination thereof that removes the material providing the absorber layer 130 selective to the material providing the underlying capping layer 120. For example, in some embodiments, the absorber layer 130 is dry etched with a gas that contains chlorine, such as $Cl_2$ or $BCl_3$, or with a gas that contains fluorine, such as $NF_3$. Argon (Ar) may be used as a carrier gas. In some embodiments, oxygen ($O_2$) may also be included as the carrier gas. The etch rate and the etch selectivity depend on the etchant gas, etchant flow rate, power, pressure, and substrate temperature. After etching, the remaining portions of the absorber layer 130 constitute the patterned absorber layer 130P.

Figure 6E:
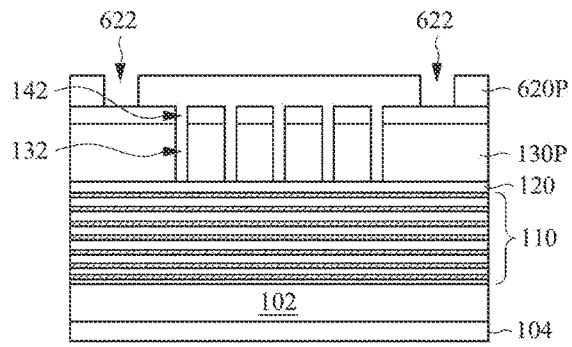

Referring to FIGS. 5 and 6E, the method 500 proceeds to operation 510, in which a patterned photoresist layer 620P comprising a pattern of openings 622 is formed over the patterned hard mask layer 140P and the capping layer 120, in accordance with some embodiments. FIG. 6E is a cross-sectional view of the structure of FIG. 6D after forming the patterned photoresist layer 620P comprising openings 622 over the patterned hard mask layer 140P and the capping layer 120, in accordance with some embodiments.

Referring to FIG. 6E, the openings 622 expose portions of the patterned hard mask layer 140P at the periphery of the patterned absorber layer 130P. The openings 622 correspond to the trenches 154 in the peripheral region 400B of the EUV mask 400 (FIG. 4). To form the patterned photoresist layer 620P, a photoresist layer (not shown) is applied over the patterned hard mask layer 140P and the capping layer 120. The photoresist layer fills the openings 142 within the patterned hard mask layer 140P and the openings 132 within the patterned absorber layer 130P. In some embodiments, the photoresist layer includes a positive-tone photoresist material, a negative-tone photoresist material, or a hybrid-tone photoresist material. In some embodiments, the photoresist layer includes a same material as the photoresist layer 610 described above in FIG. 6A. In some embodiments, the photoresist layer includes a different material from the photoresist layer 610. In some embodiments, the photoresist layer is formed, for example, by spin coating. The photoresist layer is subsequently patterned by exposing the photoresist layer to a pattern of radiation, and removing the exposed or unexposed portions of the photoresist layer using a resist developer depending on whether a positive or negative resist is used. The remaining portions of the photoresist layer constitute the patterned photoresist layer 620P.

Figure 6F:
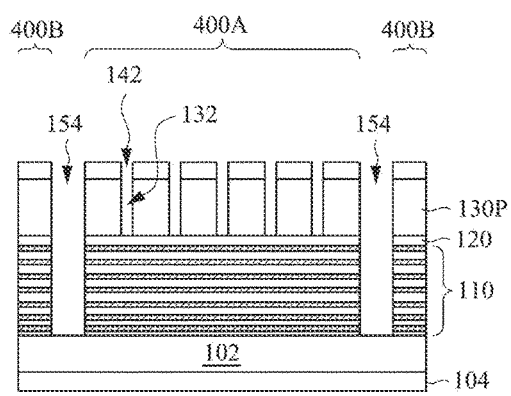

Referring to FIGS. 5 and 6F, the method 500 proceeds to operation 512, in which the patterned hard mask layer 140P, the patterned absorber layer 130P, the capping layer 120, and the reflective multilayer stack 110 are etched using the patterned photoresist layer 620P as an etch mask to form trenches 154 in the peripheral region 400B of the substrate 102, in accordance with some embodiments. FIG. 6F is a cross-sectional view of the structure of FIG. 6E after etching the patterned hard mask layer 140P, the patterned absorber layer 130P, the capping layer 120, and the reflective multilayer stack 110, to form the trenches 154 in the peripheral region 400B of the substrate 102, in accordance with some embodiments.

Referring to FIG. 6F, the trenches 154 extend through the patterned hard mask layer 140P, the patterned absorber layer 130P, the capping layer 120, and the reflective multilayer stack 110 to expose the surface of the substrate 102. The trenches 154 surround the pattern region 400A of the EUV mask 400, separating the pattern region 400A from the peripheral region 400B.

In some embodiments, the patterned hard mask layer 140P, the patterned absorber layer 130P, the capping layer 120, and the reflective multilayer stack 110 are etched using a single anisotropic etching process. The anisotropic etch can be a dry etch such as, for example, RIE, a wet etch, or a combination thereof that removes materials of the respective patterned hard mask layer 140P, patterned absorber layer 130P, capping layer 120, and reflective multilayer stack 110, selective to the material providing the substrate 102. In some embodiments, the patterned hard mask layer 140P, the patterned absorber layer 130P, the capping layer 120, and the reflective multilayer stack 110 are etched using multiple distinct anisotropic etching processes. Each anisotropic etch can be a dry etch such as, for example, RIE, a wet etch, or a combination thereof.

Subsequently, the patterned photoresist layer 620P is removed from the pattern region 400A and the peripheral region 400B of the substrate 102, for example, by wet stripping or plasma ashing. The removal of the patterned photoresist layer 620P from the openings 142 in the patterned hard mask layer 140P and the openings 132 in the patterned absorber layer 130P re-exposes the surfaces of the capping layer 120 in the pattern region 400A.

Figure 6G:
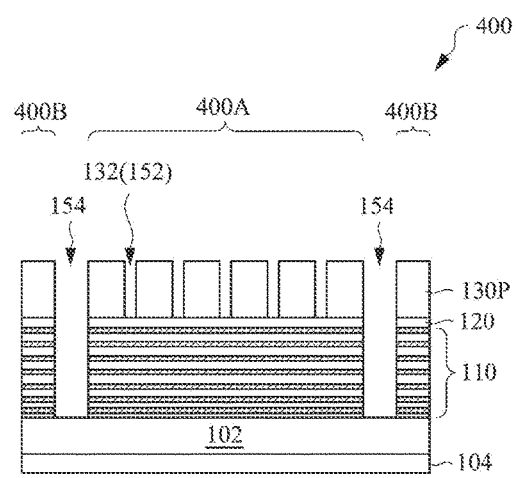

Referring to FIGS. 5 and 6G, the method 500 proceeds to operation 514, in which the patterned hard mask layer 140P is removed, in accordance with some embodiments. FIG. 6G is a cross-sectional view of the structure of FIG. 6F after removing patterned hard mask layer 140P, in accordance with some embodiments.

Referring to FIG. 6G, the removal of the patterned hard mask layer 140P exposes the surfaces of the patterned absorber layer 130P. In some embodiments, the patterned hard mask layer 140P is removed by an etching process which can be an anisotropic etch or an isotropic etch. In some embodiments, the etch can be a dry etch such as RIE or a wet chemical etch that removes the patterned hard mask layer 140P selected to the patterned absorber layer 130P, the capping layer 120, the reflective multilayer stack 110, and the substrate 102.

After removal of the patterned hard mask layer 140P, the EUV mask 400 may be cleaned to remove any contaminants therefrom. In some embodiments, the EUV mask 400 is cleaned by submerging the EUV mask 400 into an ammonium hydroxide ($NH_4OH$) solution. In some embodiments, the EUV mask 400 is cleaned by submerging the EUV mask 400 into a diluted hydrofluoric acid (HF) solution.

The EUV mask 400 is subsequently irradiated with, for example, an UV light with a wavelength of 193 nm, for inspection of any defects in the patterned region 400A. The foreign matters may be detected from diffusely reflected light. If defects are detected, the EUV mask 400 is further cleaned using suitable cleaning processes.

The patterned absorber layer 130P includes an interstitial compound having a high extinction coefficient, which allows forming a thinner absorber layer. The mask 3D effects caused by the thicker absorber layer can thus be reduced and unnecessary EUV light can be eliminated. As a result, a pattern on the EUV mask 400 can be projected precisely onto a semiconductor wafer.

Figure 7:
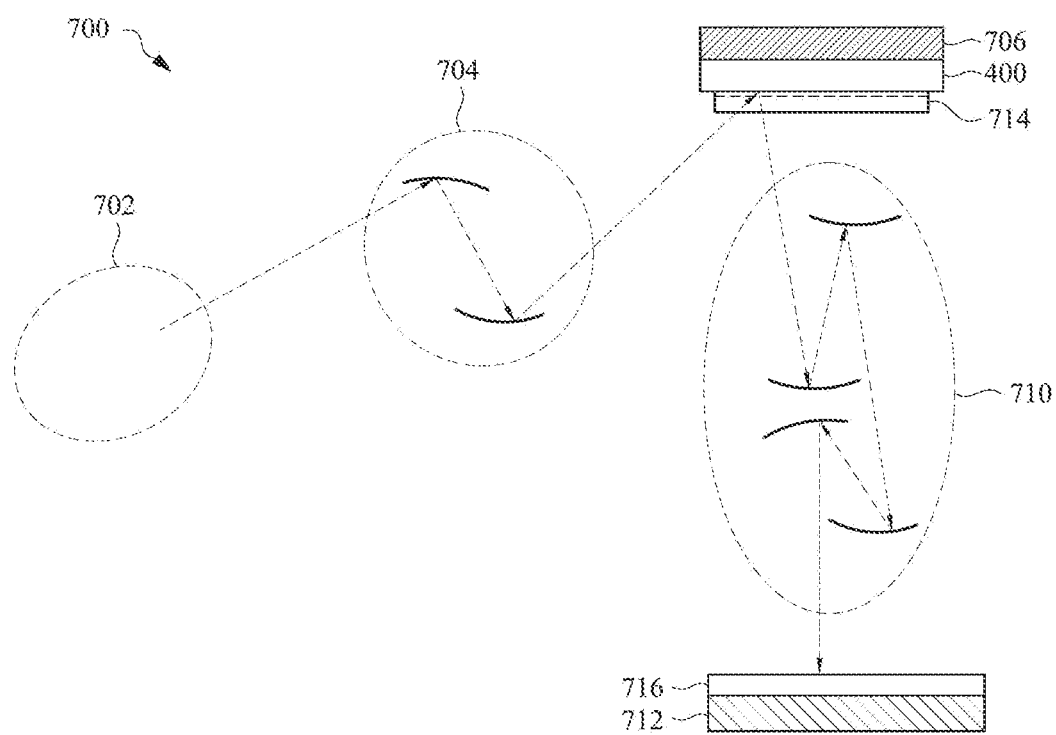
FIG. 7 is a schematic diagram of a lithography system, in accordance with some embodiments of the present disclosure.

FIG. 7 is a schematic diagram of a lithography system 700, in accordance with some embodiments of the present disclosure. The lithography system 700 may also be referred to herein as a "scanner" that is operable to perform lithography exposing processes with respective radiation sources and exposure modes.

In some embodiments, the lithography system 700 includes a high-brightness light source 702, an illuminator 704, a mask stage 706, a photomask (i.e., EUV mask 400), a projection optics module 710, and a substrate stage 712. In some embodiments, the lithography system may include additional components that are not illustrated in FIG. 7. In further embodiments, one or more of the high-brightness light source 702, the illuminator 704, the mask stage 706, the projection optics module 710, and the substrate stage 712 may be omitted from the lithography system 700 or may be integrated into combined components.

The high-brightness light source 702 may be configured to emit radiation having wavelengths in the range of approximately 1 nanometer (nm) to 250 nm. In some embodiments, the high-brightness light source 702 generates EUV light with a wavelength centered at approximately 13.5 nanometers; accordingly, the high-brightness light source 702 may also be referred to as an "EUV light source."

In embodiments where the lithography system 700 is an EUV lithography system, the illuminator 704 comprises various reflective optical components, such as a single mirror or a mirror system comprising multiple mirrors. The illuminator 704 may direct light from the high-brightness light source 702 onto the mask stage 706, and more particularly onto the EUV mask 400 that is secured onto the mask stage 706.

The mask stage 706 may be configured to secure the EUV mask 400. In some examples, the mask stage 706 may include an electrostatic chuck (e-chuck) to secure the EUV mask 400. This is because the gas molecules absorb EUV light, and the lithography system 700 for EUV lithography patterning is maintained in a vacuum environment to minimize EUV intensity loss.

In some examples, a pellicle 714 may be positioned over the EUV mask 400, e.g., between the EUV mask 400 and the substrate stage 712. The pellicle 714 may protect the EUV mask 400 from particles and may keep the particles out of focus, so that the particles do not produce an image (which may cause defects on a wafer during the lithography process).

The projection optics module 710 may be configured for imaging the pattern of the EUV mask 400 onto a semiconductor wafer 716 secured on the substrate stage 712. In some embodiments, the projection optics module 710 comprises reflective optics for the EUV lithography system. The light directed from the EUV mask 400, carrying the image of the pattern defined on the EUV mask 400, may be collected by the projection optics module 710. The illuminator 704 and the projection optics module 710 may be collectively referred to as an "optical module" of the lithography system 700.

In some embodiments, the semiconductor wafer 716 may be a bulk semiconductor wafer. For instance, the semiconductor wafer 716 may comprise a silicon wafer. The semiconductor wafer 716 may include silicon or another elementary semiconductor material, such as germanium. In some embodiments, the semiconductor wafer 716 may include a compound semiconductor. The compound semiconductor may include gallium arsenide, silicon carbide, indium arsenide, indium phosphide, another suitable material, or a combination thereof. In some embodiments, the semiconductor wafer 716 includes a silicon-on-insulator (SOI) substrate. The SOI substrate may be fabricated using a separation by implantation of oxygen (SIMOX) process, a wafer bonding process, another applicable process, or a combination thereof. In some embodiments, the semiconductor wafer 716 comprises an undoped substrate. However, in other embodiments, the semiconductor wafer 716 comprises a doped substrate, such as a p-type substrate or an n-type substrate.

In some embodiments, the semiconductor wafer 716 includes various doped regions (not shown) depending on the design requirements of the semiconductor device structure. The doped regions may include, for example, p-type wells and/or n-type wells. In some embodiments, the doped regions are doped with p-type dopants. For example, the doped regions may be doped with boron or boron fluoride. In other examples, the doped regions are doped with n-type dopants. For example, the doped regions may be doped with phosphorus or arsenic. In some examples, some of the doped regions are p-doped and other doped regions are n-doped.

In some embodiments, an interconnection structure may be formed over the semiconductor wafer 716. The interconnection structure may include multiple interlayer dielectric layers, including dielectric layers. The interconnection structure may also include multiple conductive features formed in the interlayer dielectric layers. The conductive features may include conductive lines, conductive vias, and/or conductive contacts.

In some embodiments, various device elements are formed in the semiconductor wafer 716. Examples of the various device elements may include transistors (e.g., metal oxide semiconductor field effect transistors (MOSFETs), complementary metal oxide semiconductor (CMOS) transistors, bipolar junction transistors (BJTs), high-voltage transistors, high-frequency transistors, p-channel and/or n-channel field effect transistors (PFETs and/or NFETs), diodes, or other suitable elements. Various processes may be used to form the various device elements, including deposition, etching, implantation, photolithography, annealing, and/or other applicable processes.

The device elements may be interconnected through the interconnection structure over the semiconductor wafer 716 to form integrated circuit devices. The integrated circuit devices may include logic devices, memory devices (e.g., static random access memory (SRAM) devices), radio frequency (RF) devices, input/output (I/O) devices, system-on-chip (SoC) devices, image sensor devices, other applicable devices, or a combination thereof.

In some embodiments, the semiconductor wafer 716 may be coated with a photoresist that is sensitive to EUV light. Various components including those described above may be integrated together and may be operable to perform lithography exposing processes.

Figure 8:
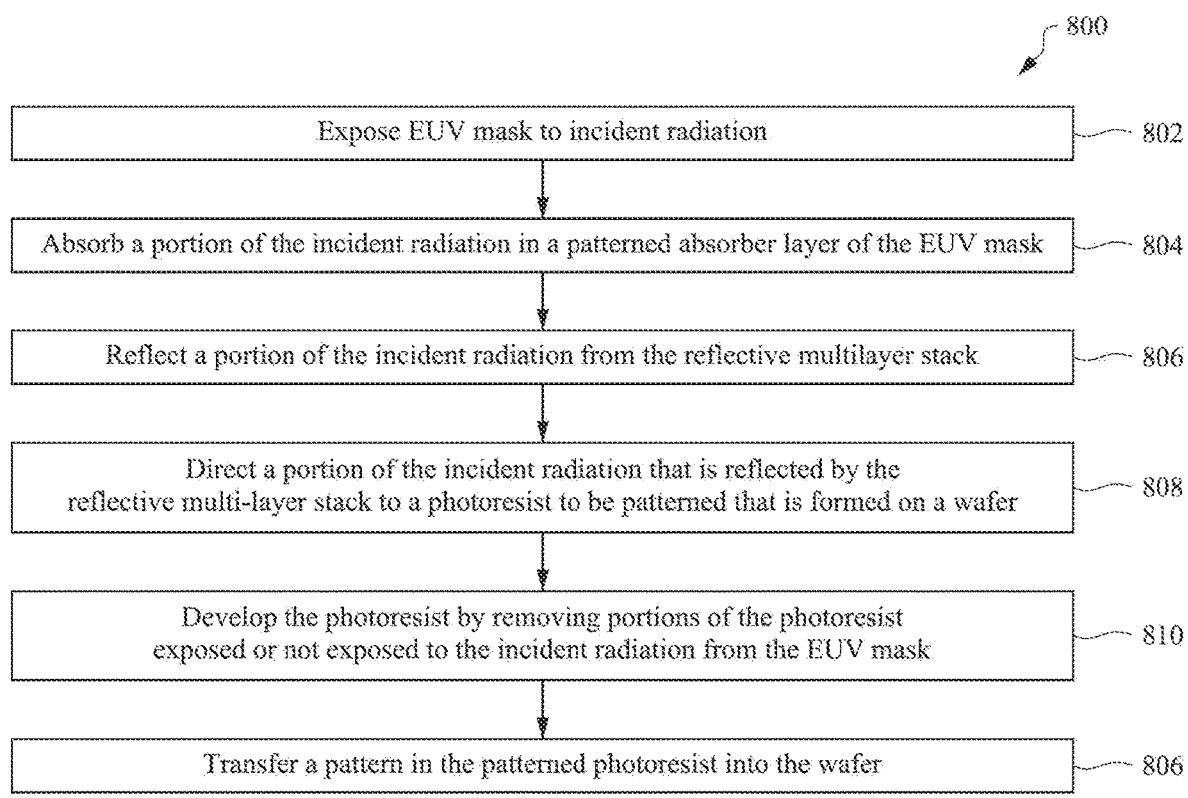
FIG. 8 is a flowchart of a method of using an EUV mask, in accordance with embodiments of the present disclosure.

FIG. 8 illustrates a method 800 of using an EUV mask, in accordance with embodiments of the present disclosure. Method 800 includes step 802 of exposing an EUV mask to an incident radiation, e.g., EUV radiation. An example of an EUV mask useful in step 802 includes the EUV mask 400 described above. At step 804, a portion of the incident radiation is absorbed by a patterned absorber layer 130P of the EUV mask 400. At step 806, a portion of the incident radiation is reflected from the reflective multilayer stack 110. A portion of the incident radiation that is reflected by the reflective multilayer stack 110 is directed to a photoresist that is disposed on a semiconductor wafer in step 808. After the photoresist to be patterned has been exposed to the radiation reflected from the EUV mask 400, portions of the photoresist exposed or not exposed to the radiation reflected from the EUV mask 400 are removed at step 810. At step 812, a pattern in the patterned photoresist is transferred into the semiconductor wafer.

One aspect of this description relates to a method for lithographically patterning a photoresist. The method includes receiving a wafer with the photoresist and exposing the photoresist using an extreme ultraviolet (EUV) radiation reflected by an EUV mask. The EUV mask includes a substrate, a reflective multilayer stack on the substrate, a capping layer on the reflective multilayer stack, a patterned absorber layer on the capping layer. The patterned absorber layer includes a matrix metal and an interstitial element occupying interstitial sites of the matrix metal, and a size ratio of the interstitial element to the matrix metal is from about 0.41 to about 0.59.

Another aspect of this description relates to relates to a method of using an EUV mask. The method includes exposing the EUV mask to an incident radiation. The EUV mask includes a reflective multilayer stack on a substrate, a capping layer on the reflective multilayer stack and a patterned absorber layer on the capping layer. The patterned absorber layer includes a matrix metal and an interstitial element occupying interstitial sites of the matrix metal, and a size ratio of the interstitial element to the matrix metal is from about 0.41 to about 0.59. The method further includes absorbing a portion of the incident radiation in the patterned absorber layer, reflecting a portion of the incident radiation from the reflective multilayer stack and directing the portion of the incident radiation that is reflected by the reflective multilayer stack to a photoresist on a wafer.

Still another aspect of this description relates to an extreme ultraviolet (EUV) mask. The EUV mask includes a substrate, a reflective multilayer stack on the substrate, a capping layer on the reflective multilayer stack, and a patterned absorber layer on the capping layer. The patterned absorber layer includes a matrix metal and an interstitial element occupying interstitial sites of the matrix metal, and a size ratio of the interstitial element to the matrix metal is from about 0.41 to about 0.59.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithographically patterning a photoresist, comprising:
   receiving a wafer with the photoresist; and
   exposing the photoresist using an extreme ultraviolet (EUV) radiation reflected by an EUV mask, the EUV mask including:
   a substrate;
   a reflective multilayer stack on the substrate;
   a capping layer on the reflective multilayer stack; and
   a patterned absorber layer on the capping layer, the patterned absorber layer being a topmost layer of the EUV mask, wherein the patterned absorber layer is a single layer consisting of a matrix metal exhibiting a cubic lattice structure or a hexagonal lattice structure and an interstitial element occupying octahedral interstitial sites of the lattice structure of the matrix metal, wherein the matrix metal is selected from the group consisting of zirconium (Zr), iridium (Ir), nickel (Ni), cobalt (Co), vanadium (V), yttrium (Y) and hafnium (Hf), and the interstitial element is selected from the group consisting of boron (B), carbon (C), nitrogen (N), silicon (Si) and phosphorus (P).

2. The method of claim 1, wherein the matrix metal is yttrium (Y).

3. The method of claim 1, wherein the patterned absorber layer comprises $ZrC$, $ZrC_2$, $ZrB_2$, $ZrN$, $ZrSi_2$, $Ir_5C_3$, $Ir_4C_5$, $IrC_2$, $Ir_3C_7$, $IrC_3$, $IrC_4$, $IrN_2$, $Ir_3Si$, $Ni_3C$, $Ni_3N$, $CO_3C$, $CO_2C$, $CO_2N$, $CO_3N$, $Co_4C$, $Co_2Si$, $V_4C_3$, $VN$, $VSi_2$, $V_3Si$, $Y_2C$, $YN$, $YB_2$, $YSi_2$, $YC_2$, $HfC$ or $HfN$.

4. The method of claim 1, wherein the patterned absorber layer has a thickness ranging from 30 nm to 40 nm.

5. The method of claim 1, wherein the capping layer comprises ruthenium (Ru).

6. A method of using an extreme ultraviolet (EUV) mask, comprising:
   exposing the EUV mask to an incident radiation, the EUV mask including:
   a reflective multilayer stack on a substrate;
   a capping layer on the reflective multilayer stack; and
   a patterned absorber layer on the capping layer, the patterned absorber layer being the topmost layer of the EUV mask, wherein the patterned absorber layer is a single layer consisting of a matrix metal exhibiting a cubic lattice structure or a hexagonal lattice structure and an interstitial element occupying octahedral interstitial sites of the lattice structure of the matrix metal, wherein the matrix metal is selected from the group consisting of zirconium (Zr), iridium (Ir), nickel (Ni), cobalt (Co), vanadium (V), yttrium (Y) and hafnium (Hf), and the interstitial element is selected from the group consisting of boron (B), carbon (C), nitrogen (N), silicon (Si) and phosphorus (P);
   absorbing a portion of the incident radiation in the patterned absorber layer;
   reflecting a portion of the incident radiation from the reflective multilayer stack; and
   directing the portion of the incident radiation that is reflected by the reflective multilayer stack to a photoresist on a wafer.

7. The method of claim 6, wherein the matrix metal is yttrium (Y).

8. The method of claim 6, wherein the patterned absorber layer comprises $Y_2C$, $YN$, $YB_2$, $YSi_2$ or $YC_2$.

9. The method of claim 6, wherein the patterned absorber layer has a thickness less than 50 nm.

10. The method of claim 6, further comprising developing the photoresist to form a patterned photoresist.

11. An extreme ultraviolet (EUV) mask, comprising:
    a substrate;
    a reflective multilayer stack on a first surface of the substrate;
    a capping layer on the reflective multilayer stack; and
    a patterned absorber layer on the capping layer, the patterned absorber layer being the topmost layer of the EUV mask, wherein the patterned absorber layer is a single layer consisting of a matrix metal exhibiting a cubic lattice structure or a hexagonal lattice structure and an interstitial element occupying octahedral interstitial sites of the matrix metal, wherein the matrix metal is selected from the group consisting of chromium (Cr), titanium (Ti), tungsten (W), zirconium (Zr), iridium (Ir), nickel (Ni), cobalt (Co), vanadium (V), yttrium (Y) and hafnium (Hf), and the interstitial element is selected from the group consisting of boron (B), silicon (Si) and phosphorus (P).

12. The EUV mask of claim 11, wherein the matrix metal is titanium (Ti) or yttrium (Y).

13. The EUV mask of claim 11, wherein the patterned absorber layer has an extinction coefficient ranging from 0.04 to 0.08, and a refractive index ranging from 0.87 to 1.

14. The EUV mask of claim 11, wherein the patterned absorber layer comprises $Cr_2B$, $CrB_2$, $TiB_2$, $TiSi_2$, $ZrB_2$, $ZrSi_2$, $Ir_3Si$, $Co_2Si$, $VSi_2$, $V_3Si$, $YB_2$ or $YSi_2$.

15. The EUV mask of claim 11, wherein the patterned absorber layer has a thickness ranging from 30 nm to 40 nm.

16. The EUV mask of claim 11, wherein the capping layer comprises ruthenium (Ru), iridium (Ir), rhodium (Rh), platinum (Pt), palladium (Pd), osmium (Os), rhenium (Re), vanadium (V), tantalum (Ta), hafnium (Hf), tungsten (W), molybdenum (Mo), zirconium (Zr), manganese (Mn), technetium (Tc), or alloys thereof.

17. The EUV mask of claim 11, wherein the reflective multilayer stack comprises alternating Si and Mo layers.

18. The EUV mask of claim 11, further comprising a conductive layer on a second surface of the substrate opposite the first surface.

19. The EUV mask of claim 18, wherein the conductive layer comprises CrN or TaB.

20. The method of claim 11, wherein the patterned absorber layer comprises $TiB_2$ or $TiSi_2$.

* * * * *